United States Patent
Savariar-Hauck et al.

(10) Patent No.: US 8,927,197 B2
(45) Date of Patent: *Jan. 6, 2015

(54) NEGATIVE-WORKING LITHOGRAPHIC PRINTING PLATE PRECURSORS

(71) Applicant: Eastman Kodak Company, Rochester, NY (US)

(72) Inventors: Celin Savariar-Hauck, Badenhausen (DE); Martin Heinrich, Osterode (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,625

(22) Filed: Nov. 16, 2012

(65) Prior Publication Data

US 2014/0141374 A1 May 22, 2014

(51) Int. Cl.

| | |
|---|---|
| *B41M 5/00* | (2006.01) |
| *B41N 1/00* | (2006.01) |
| *G03F 7/00* | (2006.01) |
| *G03F 7/26* | (2006.01) |
| *G03F 7/004* | (2006.01) |
| *B41C 1/10* | (2006.01) |
| *C09B 23/01* | (2006.01) |
| *G03F 7/029* | (2006.01) |
| *G03F 7/105* | (2006.01) |
| *G03F 7/30* | (2006.01) |

(52) U.S. Cl.
CPC .............. *G03F 7/004* (2013.01); *B41C 1/1008* (2013.01); *C09B 23/0066* (2013.01); *G03F 7/029* (2013.01); *G03F 7/105* (2013.01); *G03F 7/3035* (2013.01)
USPC ........ 430/302; 430/270.1; 430/309; 430/332; 101/453; 101/463.1

(58) Field of Classification Search
CPC . B41C 2210/04; B41C 2210/08; G03F 7/004; B41M 5/465; B41M 1/06
USPC .......... 430/270.1, 302; 101/450.1, 453, 463.1
See application file for complete search history.

(56) References Cited

U.S. PATENT DOCUMENTS

| | | | |
|---|---|---|---|
| 6,153,356 A | 11/2000 | Urano et al. | |
| 6,461,804 B1 | 10/2002 | Deroover | |
| 7,429,445 B1 | 9/2008 | Munnelly et al. | |
| 8,034,538 B2 | 10/2011 | Strehmel et al. | |
| 8,247,163 B2 | 8/2012 | Memetea et al. | |
| 2003/0068575 A1 | 4/2003 | Yanaka | |
| 2003/0215744 A1 | 11/2003 | Gries | |
| 2004/0197701 A1 | 10/2004 | Mitsumoto et al. | |
| 2004/0229165 A1 | 11/2004 | Munnelly et al. | |
| 2005/0170282 A1 | 8/2005 | Inno et al. | |
| 2005/0233251 A1 | 10/2005 | Kakino et al. | |
| 2005/0271976 A1 | 12/2005 | Kakino et al. | |
| 2006/0046189 A1 | 3/2006 | Kunita et al. | |
| 2007/0072119 A1 | 3/2007 | Iwai et al. | |
| 2007/0082291 A1* | 4/2007 | Kakino et al. | 430/270.1 |
| 2007/0212643 A1* | 9/2007 | Iwai et al. | 430/270.1 |
| 2008/0311524 A1 | 12/2008 | Vermeersch et al. | |
| 2009/0047599 A1 | 2/2009 | Horne et al. | |
| 2009/0269699 A1 | 10/2009 | Munnelly et al. | |
| 2010/0040976 A1 | 2/2010 | Callant et al. | |
| 2010/0055414 A1* | 3/2010 | Tao et al. | 428/195.1 |
| 2010/0227269 A1 | 9/2010 | Simpson et al. | |
| 2010/0316956 A1 | 12/2010 | Memetea et al. | |
| 2011/0104450 A1* | 5/2011 | Memetea et al. | 428/195.1 |

FOREIGN PATENT DOCUMENTS

| | | |
|---|---|---|
| EP | 1 162 078 A2 | 12/2001 |
| EP | 1162078 A2 * | 12/2001 |
| EP | 1 464 486 A2 | 10/2004 |
| EP | 1 508 836 A2 | 2/2005 |
| EP | 1508836 A2 * | 2/2005 |
| JP | 2007-237523 | 9/2007 |

OTHER PUBLICATIONS

Nagao, Yukinon et al., "Synthesis and Property of barbiturate indolenine heptamethine cyanine dyes", Dyes and Pigments, 73 (2007) 344-352 ( www.sciencedirect.com).*
K. Hayashi, et al., "On-Press Developable Lithographic Printing Plate Precursors", U.S. Appl. No. 13/277,266, filed Oct. 20, 2011.
"Few Functional Dyes" From the Internet at http://www.few.de/fileadmin/daten/Kataloge/FEW_FunDyes_2011.pdf.

* cited by examiner

*Primary Examiner* — Chanceity Robinson
(74) *Attorney, Agent, or Firm* — J. Lanny Tucker

(57) ABSTRACT

A negative-working lithographic printing plate precursor is used for making lithographic printing plates from infrared radiation imaging. The precursor comprises free radical chemistry and a specific infrared radiation absorber that is a cyanine dye and defined by Formula (1a) described in the disclosure. This particular infrared radiation absorber provides both IR sensitivity and print out after imaging.

9 Claims, No Drawings

NEGATIVE-WORKING LITHOGRAPHIC PRINTING PLATE PRECURSORS

FIELD OF THE INVENTION

This invention relates to negative-working lithographic printing plate precursors that can be imaged using thermal energy and developed on-press to provide lithographic printing plates. The invention also relates to a method of using these negative-working lithographic printing plate precursors with on-press development to prepare lithographic printing plates.

BACKGROUND OF THE INVENTION

In lithographic printing, ink receptive regions, known as image areas, are generated on a hydrophilic surface. When the surface is moistened with water and lithographic ink is applied, the hydrophilic regions retain the water and repel the lithographic ink the ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more imageable layers applied over a hydrophilic surface of a substrate (or hydrophilic intermediate layers). The imageable layer(s) can comprise one or more radiation-sensitive components dispersed within a suitable binder. Following imaging, either the exposed regions or the non-exposed regions of the imageable layer(s) are removed by a suitable processing solution (developer), revealing the underlying hydrophilic surface. If the exposed regions are removed, the precursor is considered as positive-working. Conversely, if the non-exposed regions are removed, the precursor is considered as negative-working. In each instance, the regions of the imageable layer(s) that remain are ink-receptive, and the regions of the hydrophilic surface revealed by the developing process accept water or aqueous solutions (typically a fountain solution), and repel lithographic ink.

Various negative-working imageable elements have been designed for processing or development "on-press" using a fountain solution, lithographic printing ink, or both. For example, such elements are described in U.S. Patent Application Publication 2005-263021 (Mitsumoto et al.) and in U.S. Pat. No. 6,071,675 (Teng), U.S. Pat. No. 6,387,595 (Teng), U.S. Pat. No. 6,482,571 (Teng), U.S. Pat. No. 6,495,310 (Teng), U.S. Pat. No. 6,541,183 (Teng), U.S. Pat. No. 6,548,222 (Teng), U.S. Pat. No. 6,576,401 (Teng), U.S. Pat. No. 6,899,994 (Huang et al.), U.S. Pat. No. 6,902,866 (Teng), and U.S. Pat. No. 7,089,856 (Teng).

U.S. Pat. No. 7,429,445 (Munnelly et al.) describes on-press developable negative-working lithographic printing plate precursors that contain various infrared radiation absorbing dyes that have tetraaryl pentadiene chromophores, and nonionic phosphate acrylates to increase imaging sensitivity. By "on-press" developable, it is meant that the imaged precursor does not need a separate processing step for development before it is placed on a printing press. Thus, processing or development can occur during the first few printed impressions on the printing press.

U.S. Patent Application Publication 2009-0269699 (Munnelly et al.) describes the use of IR absorbable dyes to improve color contrast in on-press developable lithographic printing plate precursor.

In general, lithographic printing plates contain a colorant (dye or pigment) in the radiation-sensitive composition (imageable layer) that has the function of making the image visible after processing in order to be inspected and evaluated for plate positioning and bar code readability prior to pre-press calibration. Such colorants provide contrast between the image and the background. This image contrast (print out) is particularly needed for lithographic printing plate precursors designed for development on-press. However, certain lithographic printing plates cannot contain a colorant for different reasons. For example, the imaged lithographic printing plate precursors that are usually developed on-press have a colorless coating because if a colorant is present, it could contaminate the lithographic printing ink and the fountain solution used for development and printing, with the result of altering the printed color shades. However, sometimes it is necessary for such printing plates to be used the same way as those developed off-press. In such instances, the image needs to be seen and evaluated with sufficient printout.

U.S. Patent Application Publication 2010-0227669 (Simpson et al.) describes the use of a visible pigment and dye mixture for color contrast. U.S. Pat. No. 8,034,538 (Strehmel et al.) describes the use of water-soluble visible contrast dyes.

For imaged elements that are to be developed on-press, the image is not easily identified. Adding colorant to on-press developable imaging compositions compromises plate shelf life, on-press developability, or imaging sensitivity, and the colorant may color-contaminate printing press inks. Thus, there is a need for an adequate print-out that provides visibility to the image on the printing plate before on-press development. Simply increasing imaging energy beyond that required for image durability may improve the printout, however, with a resulting increase in dot gain. Furthermore, increasing the exposure energy reduces productivity for the customer, which means that the number of printing plates that can be produced per hour is decreased.

U.S. Patent Application Publications 2005/0170282 (Inno et al.), 2005/0233251 (Kakino et al.), 2003/0068575 (Yanaka), 2006/0046189 (Kunita et al.), and 2007/0072119 (Iwai et al.), and U.S Patent Application Publications 2008/0311524 (Callant et al.), 2010/0040976 (Callant et al.), and 2005/0271976 (Kakino et al.) describe lithographic printing plate precursors that contain a discoloring agent or system capable of generating a color change upon exposure for providing print-out.

U.S. Patent Application Publication 2009/0047599 (Horne et al.) describes the use of specific spirolactone or spirolactam leuco dye color formers in the imageable layer of negative-working imageable elements.

U.S. Pat. No. 8,247,163 (Memetea et al.) describes the application of a coloring fluid to the imaged precursor such that the optical density in the solid exposed regions is $OD_2$ that is greater than $OD_1$. This coloring fluid comprises a water-insoluble colorant and a solvent that is capable of swelling the solid exposed regions of the imageable layer.

U.S. Patent Application Publication 2010-0227669 (Simpson et al.) describes the use of a visible pigment and dye mixture for color contrast. U.S. Pat. No. 8,034,538 (Strehmel et al.) describes the use of water-soluble visible contrast dyes.

The desired feature of good run length is influenced by the degree of polymerization or crosslinking of the ethylenically unsaturated components in the imageable layer. Additives that enhance printout usually do not participate in the crosslinking reactions and therefore do not contribute to the run length and could even be responsible to reducing run length. Therefore it is a goal to reduce the number of components that do not participate in the crosslinking. For thermal photopolymer imageable layers that require an infrared radiation absorber for image formation, the selection of components is determined to a large extent on obtaining high lithographic printing plate precursor sensitivity and shelf life. Therefore an infrared radiation absorber that not only provides high sensitivity and shelf life but also is effective to provide a strong color change is highly desirable. It is a further desire to obtain these features with a single absorber without a need for combination of infrared radiation absorbers.

SUMMARY OF THE INVENTION

The present invention provides a negative-working lithographic printing plate precursor comprising a substrate and a negative-working imageable layer disposed on the substrate, the negative-working imageable layer comprising an infrared radiation absorber, a compound to provide free radicals upon exposure to infrared radiation in the presence of the infrared radiation absorber, a free radical polymerizable compound, and optionally a polymer binder, wherein the infrared radiation absorber is a cyanine dye represented by Formula (1a):

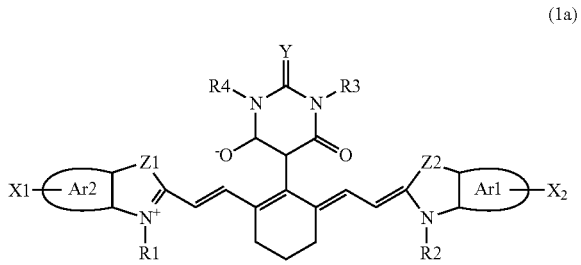

(1a)

wherein Z1 and Z2 independently represent S, O, $NR^a$, or $C(R^b)_2$,

R1 and R2 independently represent hydrogen or a substituted or unsubstituted alkyl group, R3 and R4 are independently hydrogen or substituted or unsubstituted alkyl, substituted or unsubstituted alkoxy, substituted or unsubstituted aryl, or substituted or unsubstituted cycloalkyl groups, Ar1 and Ar2 are independently aromatic hydrocarbon groups that can have one or more substituents X1 and X2 that independently represent hydrogen, a substituted or unsubstituted alkyl group, —$COOR^a$, —$OR^a$, —$SR^a$, or —$N(R^a)_2$ group, or a halogen atom, $R^a$ represents a hydrogen atom, or a substituted or unsubstituted alkyl or aryl group, $R^b$ represents an alkyl groups having 1 to 4 carbon atoms, and Y represents O or S.

This invention also provides a method for providing a lithographic printing plate comprising:

imagewise exposing a negative-working lithographic printing plate precursor of any embodiments of this invention to infrared radiation to provide an imaged precursor comprising exposed and non-exposed regions in the negative-working imageable layer, and processing the imaged precursor to remove the negative-working imageable layer in the non-exposed regions.

The present invention provides a number of advantages. The improved negative-working lithographic printing plate precursor comprises a unique infrared radiation absorber that provides both the desired IR sensitivity for imaging but also the desired print out visibility after imaging. The precursor is readily developed on-press with good printing run length.

DETAILED DESCRIPTION OF THE INVENTION

Definitions

As used herein to define various components of the negative-working lithographic printing plate precursors, formulations, components, and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor", "negative-working lithographic printing plate precursor", and "precursor" are meant to be references to embodiments of the present invention.

Unless otherwise indicated, percentages refer to percents by dry weight of a composition or layer, or % solids of a solution or formulation.

As used herein, the term "infrared" refers to radiation having a $\lambda_{max}$ of at least 700 nm and higher. In most instances, the term "infrared" is used to refer to the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Infrared Radiation Absorbers

The precursors of this invention include one or more infrared radiation absorbers, but in most embodiments, they comprise only one or more of compounds described below and represented by Formula (1a). In such embodiments, the imageable layer comprises an infrared radiation absorber composition that consists essentially of one or more compounds represented by Formula (1a) and no other infrared radiation absorbers are purposely added to the precursors. These infrared radiation absorbers are sensitive at a wavelength of at least 700 nm to and including 1400 nm, or more likely of at least 750 nm to and including 1250 nm. By "essentially only", it is meant that infrared radiation absorbers other than those described herein by Formula (1a) are present in the precursor in an amount of less than 5 weight %, based on the dry weight of total infrared radiation absorbers in the precursors.

Each of the infrared radiation absorbers useful in this invention is a cyanine dye that is represented by the following Formula (1a):

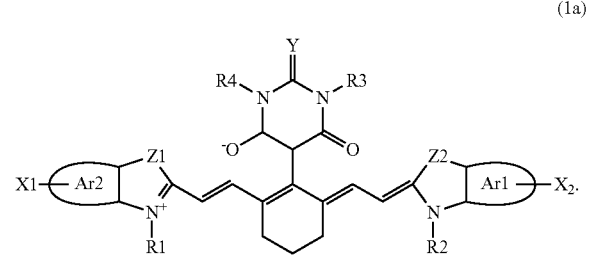

(1a)

Z1 and Z2 independently represent S, O, $NR^a$, or $C(R^b)_2$ and in particular, each of Z1 and Z2 is the same atom or group, such as the same $C(R^b)$ group such as the same substituted or unsubstituted methyl group.

R1 and R2 independently represent hydrogen or a substituted or unsubstituted alkyl group having 1 to 20 carbon atoms (linear or branched). Particularly useful R1 and R2 alkyl groups include but are not limited to, substituted or unsubstituted methyl, ethyl, and butyl (all isomers) groups, including such groups that are substituted with one or more carboxyl or sulfonic acid groups.

R3 and R4 are independently hydrogen or substituted or unsubstituted alkyl having 1 to 8 carbon atoms, substituted or unsubstituted alkoxy having 1 to 8 carbon atoms, substituted or unsubstituted aryl having 6 or 10 carbon atoms in the aryl ring, or substituted or unsubstituted cycloalkyl groups having 5 to 10 carbon atoms in the carbocyclic ring, Ar1 and Ar2 independently represent aromatic hydrocarbon groups (single or fused aromatic groups) that can have one or more substituents X1 and X2. The Ar1 and Ar2 aromatic hydrocarbon groups can comprise 6 or 10 carbon atoms in the aromatic rings. These aromatic hydrocarbon groups can be substituted with one or more X1 and X2 groups that can independently represent hydrogen, a substituted or unsubstituted alkyl group having 1 to 6 carbon atoms, —$COOR^a$, —$OR^a$, —$SR^a$, or —$N(R^a)_2$ group, or a halogen atom. Particularly useful aromatic hydrocarbon groups are unsubstituted aromatic hydrocarbon groups having 6 or 10 carbon atoms in the rings.

$R^a$ represents a hydrogen atom, or a substituted or unsubstituted alkyl having 1 to 3 carbon atoms, a substituted or unsubstituted cycloalkyl groups having 5 to 10 carbon atoms, or a substituted or unsubstituted aryl group having 6 or 10 atoms in the carbocyclic ring (such as a substituted or unsubstituted phenyl group). Particularly useful $R^a$ groups are substituted or unsubstituted methyl groups.

$R^b$ represents a substituted or unsubstituted alkyl groups having 1 to 4 carbon atoms. Particularly useful $R^b$ groups are substituted or unsubstituted methyl groups.

Y represents an oxygen or sulfur atom.

Representative examples of infrared radiation absorbers useful in the present invention are shown below in the Examples, and they can be obtained from a number of commercial sources.

The infrared radiation absorber described defined by Formula (1a) is present in the negative-working imageable layer or the precursor in an amount of at least 0.2 weight % and up to and including 20 weight %, or typically at least 1 weight % and up to and including 8 weight %, based on the total dry negative-working imageable layer weight.

Substrates

In general, the negative-working lithographic printing plate precursors are formed by suitable application of a negative-working imageable layer formulation to a suitable substrate to form a negative-working imageable layer. This substrate can be formed of any suitable polymeric or metallic material that is suitable for such purposes, but in most embodiments, the substrate is an aluminum-containing substrate that can be treated or coated in various ways as described below prior to application of the negative-working imageable layer formulation.

The aluminum-containing substrate generally has a hydrophilic surface, or a surface that is more hydrophilic than the applied negative-working imageable layer formulation on the imaging side. The aluminum-containing substrate comprises an aluminum support that is coated or treated using physical graining, electrochemical graining and chemical graining, followed by anodizing using a suitable acid to provide the desired anodic oxide surface and a desired oxide pore diameter. The aluminum sheet is mechanically or electrochemically grained and anodized using phosphoric acid or sulfuric acid and conventional procedures.

An interlayer can be formed on the aluminum-containing substrate by treating it with an aqueous solution of poly(vinyl phosphonic acid) (PVPA) to provide a poly(vinyl phosphonic acid) interlayer. This interlayer formulation can be formed by dissolving poly(vinyl phosphonic acid) in water in an amount of at least 0.05 weight % and up to and including 20 weight %. The formulation can also include optional components such as phosphoric acid, poly(acrylic acid), and copolymers derived in part from vinyl phosphonic acid. The interlayer formulation is applied using any suitable manner and dried to provide a layer having a dry coverage of at least 10 mg/m² and up to and including 200 mg/m².

The thickness of the grained and anodized aluminum-containing substrate (with or without interlayer) can be varied but should be sufficient to sustain the wear from printing and thin enough to wrap around a printing form. Some embodiments include a grained and anodized aluminum-containing substrate that has a thickness of from at least 100 μm and up to and including 600 μm.

The backside (non-imaging side) of the substrate can be coated with a non-radiation-sensitive slipping or matte layer to improve handling and "feel" of the lithographic printing plate precursor.

The aluminum-containing substrate can also be in a cylindrical form and thus be an integral part of the printing press. The use of such imageable cylinders is described for example in U.S. Pat. No. 5,713,287 (Gelbart) that is incorporated herein by reference.

Negative-Working Lithographic Printing Plate Precursors

The precursors of this invention are negative-working, and can be formed by suitable application of a negative-working radiation-sensitive composition or imageable layer formulation as described below to a suitable substrate (described above) to form a negative-working imageable layer. There is only a single imageable layer comprising the radiation-sensitive composition and can be the outermost layer in the precursor or an oxygen barrier or topcoat can be applied over it as described below.

Some of the details of negative-working lithographic printing plate precursors useful in the present invention are described for example, in U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.) all of which are incorporate herein by reference. Other negative-working composition and precursor details are provided for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi) that are also incorporated herein by reference.

The negative-working radiation-sensitive compositions and imageable layers in the precursors generally include one or more polymeric binders that facilitate the on-press developability of the imaged precursors. Such polymeric binders include but are not limited to, those that are not generally crosslinkable and are usually present at least partially as discrete particles (not-agglomerated). Such polymers can be present as discrete particles having an average particle size of at least 10 nm and up to and including 500 nm, and typically at least 100 nm and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), cyano side chains, or both, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and US Patent Application Publication 2005/0003285 (Hayashi et al.) all of which are incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in random fashion, attached to the polymer backbone, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly(urethane-acrylic) hybrids that are distributed (usually uniformly) throughout the imageable layer. Each of these hybrids has a molecular weight of at least 50,000 and up to and including 500,000 and the particles have an average particle size of at least 10 and up to and including 10,000 nm (typically at least 30 and up to and including 500 nm or at least 30 and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, antifoaming agents, dispersing agents, anti-corrosive agents, and optionally pigments and water-miscible organic solvents.

The useful polymeric binders are generally present in an amount of at least 5 weight % and up to and including 70 weight % of the radiation-sensitive composition.

The negative-working radiation-sensitive composition can include a secondary polymeric binder that can be homogenous, that is, non-particulate or dissolved in the coating solvent, or they may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents incorporated herein by reference. Random copolymers of polyethylene glycol methacrylate/acrylonitrile/styrene in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxylethyl methacrylate)/acrylonitrile/N-phenyl maleimide, and random copolymers derived from N-methoxymethyl methacrylamide/methacrylic acid/acrylonitrile/n-phenylmaleimide are useful.

The negative-working radiation-sensitive composition (and imageable layer) generally includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include those derived from urea urethane(meth)acrylates or urethane(meth) acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (noted above) that include 1H-tetrazole groups.

In addition to, or in place of the free radically polymerizable components described above, the negative-working radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This negative-working radiation-sensitive composition also includes an initiator composition that includes one or more initiators that are capable of generating free radicals sufficient to initiate polymerization of all the various free radically polymerizable components upon exposure of the composition to imaging infrared radiation. The initiator composition is responsive, for example, to electromagnetic radiation in the infrared spectral regions, corresponding to the broad spectral range of at least 700 nm and up to and including 1400 nm, and typically radiation of at least 700 nm and up to and including 1250 nm.

More typically, the initiator composition includes one or more an electron acceptors and one or more co-initiators that are capable of donating electrons, hydrogen atoms, or a hydrocarbon radical.

In general, suitable initiator compositions for IR-radiation sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Useful initiator compositions for IR radiation sensitive compositions also include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis (4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

Further details of useful IR-radiation sensitive compositions are described, for example, in the following patent and publications all of which are incorporated herein by reference:

U.S. Pat. No. 7,452,638 (Yu et al.),
U.S. Patent Application Publication 2008/0254387 (Yu et al.),
U.S. Patent Application Publication 2008/0311520 (Yu et al.),
U.S. Patent Application Publication 2009/0263746 (Ray et al.), and
U.S. Patent Application Publication 2010/0021844 (Yu et al.).

The imageable layer can also include a "primary additive" that is a poly(alkylene glycol) or an ether or ester thereof that has a molecular weight of at least 200 and up to and including 4000. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate.

The imageable layer can further include a "secondary additive" that is a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts.

The radiation-sensitive composition and imageable layer can also contain a phosphate(meth)acrylate having a molecular weight generally greater than 250 as described in U.S. Pat. No. 7,429,445 (Munnelly et al.). By "phosphate(meth)acrylate" we also mean "phosphate methacrylates" and other derivatives having substituents on the vinyl group in the acrylate moiety.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the various components needed for a specific imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Invention Examples below. After proper drying, the coating weight of the negative-working imageable layer is generally at least 0.1 g/m$^2$ and up to and including 5 g/m$^2$ or at least 0.5 g/m$^2$ and up to and including 3.5 g/m$^2$.

Layers can also be present under the negative-working imageable layer to enhance developability or to act as a thermal insulating layer.

In some embodiments, the element may include a water-soluble or water-dispersible overcoat (also known as an "oxygen impermeable topcoat" or "oxygen barrier layer") disposed over the imageable or radiation-sensitive layer, for example, as described in EP Patent Publications 1,788,429 (Loccufier et al.), 1,788,431 (Van Damme et al.) and 1,788,434 (Van Damme et al.) and U.S. Patent Application Publication 2005/0266349 (Van Damme et al.), and U.S. Pat. No. 8,137,896 (Patel et al., particularly Col. 16), all of which are incorporated herein by reference. Such overcoat layers can comprise a poly(vinyl alcohol), poly(vinyl pyrrolidone), or mixtures thereof as the predominant polymeric binder. If present, the overcoat is generally the outermost layer of the imageable element.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art.

Imaging and Processing

During use, the lithographic printing plate is exposed to a suitable source of exposing radiation depending upon the sensitivity of the negative-working radiation-sensitive composition to provide specific sensitivity that is at a wavelength of at least 700 nm and up to and including 1400 nm, or at least 750 nm and up to and including 1250 nm. For example, imaging can be carried out using imaging or exposing radiation from an infrared laser (or array of lasers) at a wavelength of at least 750 nm and up to and including about 1400 nm and typically at least 750 nm and up to and including 1250 nm. Imaging can be carried out using imaging radiation at multiple wavelengths at the same time if desired.

The laser used to expose the lithographic printing plate precursor is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak'® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged lithographic printing plate precursors are developed "on-press" as described in more detail below. In most embodiments, a post-exposure baking step is omitted. On-press development avoids the use of alkaline developing solutions typically used in conventional processing apparatus. The imaged precursor is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged precursor to the receiving material. The imaged precursors can be cleaned between impressions, if desired, using conventional cleaning means.

The presence of the infrared radiation absorber described above, which also has absorbance in the visible region of the electromagnetic spectrum, allows for visual inspection of the lithographic printing plate at any time.

The present invention provides at least the following embodiments and combinations thereof, but other combinations of features are considered to be within the present invention as a skilled artisan would appreciate from the teaching of this disclosure:

1. A negative-working lithographic printing plate precursor comprising a substrate and a negative-working imageable layer disposed on the substrate, the negative-working imageable layer comprising an infrared radiation absorber, a compound to provide free radicals upon exposure to infrared radiation in the presence of the infrared radiation absorber, a free radical polymerizable compound, and optionally a polymer binder, wherein the infrared radiation absorber is a cyanine dye represented by Formula (1a):

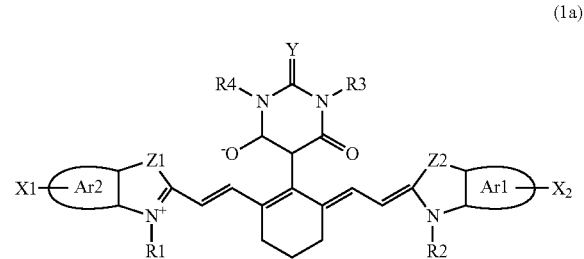

(1a)

wherein Z1 and Z2 independently represent S, O, NR$^a$, or C(R$^b$)$_2$,

R1 and R2 independently represent hydrogen or a substituted or unsubstituted alkyl group, R3 and R4 are independently hydrogen or substituted or unsubstituted alkyl, substituted or unsubstituted alkoxy, substituted or unsubstituted aryl, or substituted or unsubstituted cycloalkyl groups, Ar1 and Ar2 are independently aromatic hydrocarbon groups that can have one or more substituents X1 and X2 that independently represent hydrogen, a substituted or unsubstituted alkyl group, —COOR$^a$, —OR$^a$, —SR$^a$, or —N(R$^a$)$_2$ group, or a halogen atom, R$^a$ represents a hydrogen atom, or a substituted or unsubstituted alkyl or aryl group, R$^b$ represents an alkyl groups having 1 to 4 carbon atoms, and Y represents O or S.

2. The precursor of embodiment 1, wherein the infrared radiation absorber is present in the negative-working imageable layer in an amount of at least 0.2 weight % and up to and including 20 weight %.

3. The precursor of embodiment 1 or 2, wherein the negative-working imageable layer comprises a polymeric binder as discrete particles, or pendant groups comprising ethylenically unsaturated polymerizable groups.

4. The precursor of any of embodiments 1 to 3, wherein the negative-working imageable layer, after infrared radiation imaging exposure, is removable with a lithographic printing ink, a fountain solution, or both a lithographic printing ink and a fountain solution.

5. The precursor of any of embodiments 1 to 4, wherein the compound to provide free radicals upon exposure to infrared radiation in the presence of the infrared radiation absorber is an onium salt.

6. The precursor of any of embodiments 1 to 5, wherein the compound to provide free radicals upon exposure to infrared radiation in the presence of the infrared radiation absorber is an iodonium salt.

7. The precursor of any of embodiments 1 to 6, wherein the compound to provide free radicals upon exposure to infrared radiation in the presence of the infrared radiation absorber is an iodonium tetraaryl borate.

8. The precursor of any of embodiments 1 to 7, wherein the negative-working imageable layer further comprises a compound that changes color in the presence of a strong acid.

9. The precursor of any of embodiments 1 to 8, wherein the compound to provide free radicals upon exposure to infrared radiation in the presence of the infrared radiation absorber, comprises an iodonium tetraaryl borate and an onium salt whose anion is not a tetraaryl borate anion.

10. The precursor of embodiments 1 to 9, comprising one or more infrared radiation absorbers represented by Formula 1a and no other infrared radiation absorbers.

11. A method for providing a lithographic printing plate comprising:

imagewise exposing a negative-working lithographic printing plate precursor of any of embodiments 1 to 10 to infrared radiation to provide an imaged precursor comprising exposed and non-exposed regions in the negative-working imageable layer, and processing the imaged precursor to remove the negative-working imageable layer in the non-exposed regions.

12. The method of embodiment 11, wherein the imaged precursor is processed on-press with a lithographic printing ink, fountain solution, or both a lithographic printing ink and fountain solution.

The following Examples are provided to illustrate the practice of this invention and are not meant to be limiting in any manner.

The following components were used in the Examples:

Byk® 336 surfactant was obtained from Byk Chemie (Wallingford, Conn.).

Copolymer A latex polymer was derived from poly(ethylene glycol) methacrylate, acrylonitrile, and styrene at 10:70:20 weight ratio (Binder-dispersion) in 80:20 propanol:water solvent.

Klucel® M is a hydroxypropyl cellulose that was obtained from Hercules Inc. (Wilmington, Del.).

Elvacite® 4026 is a solid acrylic bead resin.

IB05 represents bis-(4-t-butylphenyl)iodonium tetraphenylborate.

Irgacure® 250 contains iodonium, (4,-methylphenyl)[4-(2-methylpropyl)phenyl]-,
hexafluorophosphate that was obtained from Ciba Specialty Chemicals
(Tarrytown, N.Y.) as a 75% (weight) solution in propylene carbonate.

The IR dye structures are as shown below.

SR602 is an ethoxylated bisphenol A diacrylate that is obtained from Sartomer.

Oligomer A was a urethane acrylate that was prepared by reacting Desmodur®
N100 (an aliphatic polyisocyanate resin based on hexamethylene diisocyanate from Bayer Corp., Milford, Conn.) with hydroxyethyl acrylate and pentaerythritol triacrylate (80 weight % in 2-butanone).

Phosmer PE is an ethylene glycol methacrylate phosphate having 4-5 ethoxy groups, which was obtained from Uni-Chemical Co. Ltd.

Substrate 1 was an electrochemically-grained and phosphoric acid-anodized aluminum support having an oxide weight of 1.2 g/m$^2$ that had been post-treated with a poly(acrylic acid) sublayer at 0.3 g/m$^2$ dry coverage.

Substrate 2 is an electrochemically-grained and sulfuric acid-anodized aluminum support having an oxide weight of 3.8 g/m$^2$ that had been pore widened with 0.25% NaOH and post-treated with poly(acrylic acid).

Solvent Mixture A is a mixture of n-propanol/methyl ethyl ketone/propylene glycol monomethyl ether/water/γ-butyrolactone in a weight ratio of 39/40/10/10/1.

Irganox® 1035 is a phenolic antioxidant, thiodiethylene bis [3-(3,5-di-t-butyl-4-hydroxy-phenyl)propionate] that is available from BASF.

KAN169301

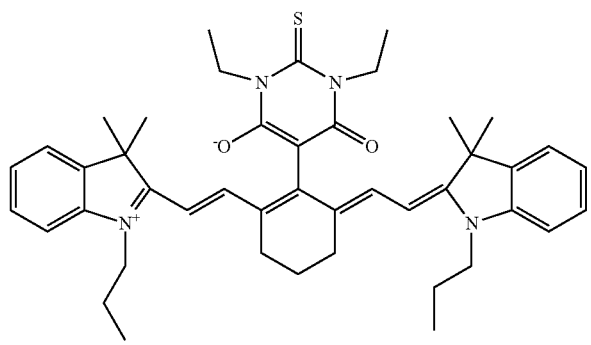

KAN169429
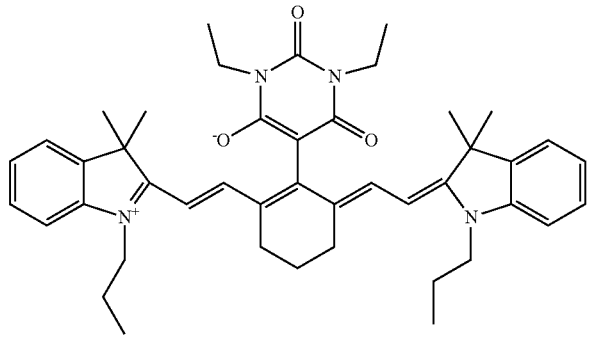
KAN169434
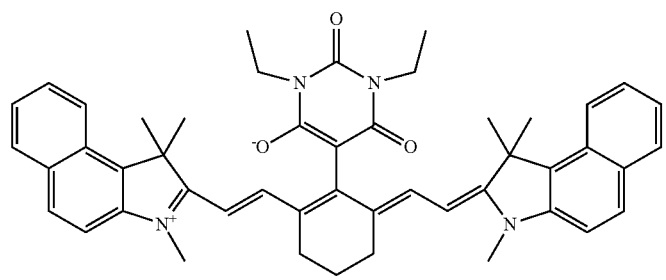
KAN169527
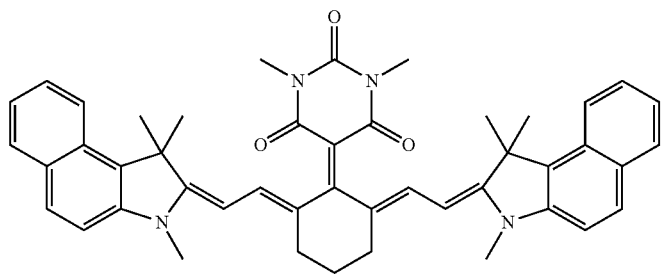 [SMILES: CN1C(=O)C(=C2/C(=C/C=C3/N(C)c4ccc5ccccc5c4C3(C)C)CCC/C2=C\C=C2\N(C)c3ccc4ccccc4c3C2(C)C)C(=O)N(C)C1=O]
S0485
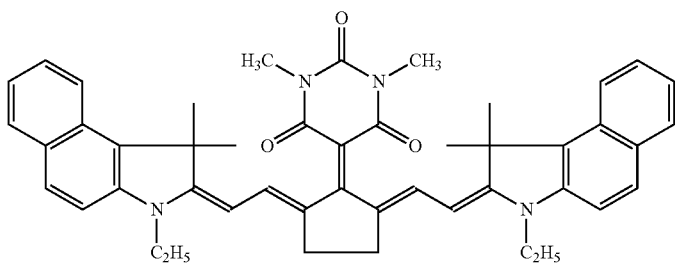 [SMILES: CCN1/C(=C/C=C2\CC/C(=C\C=C3\N(CC)c4ccc5ccccc5c4C3(C)C)C2=C2C(=O)N(C)C(=O)N(C)C2=O)C(C)(C)c2c1ccc1ccccc21]
S0322
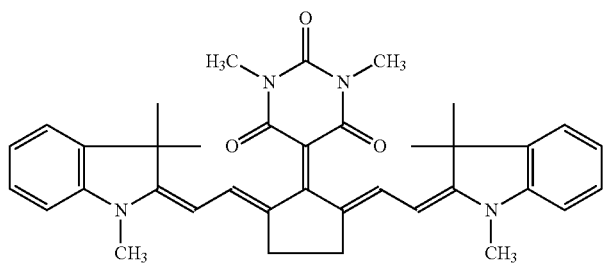

-continued
S0325
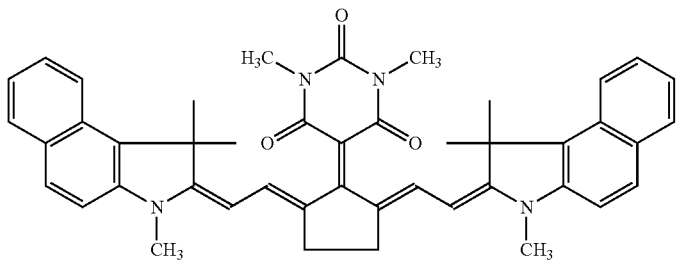 [SMILES: CN1C(=O)C(=C2/C(=C/C=C3/N(C)c4ccc5ccccc5c4C3(C)C)CC/C2=C\C=C2\N(C)c3ccc4ccccc4c3C2(C)C)C(=O)N(C)C1=O]
S0485
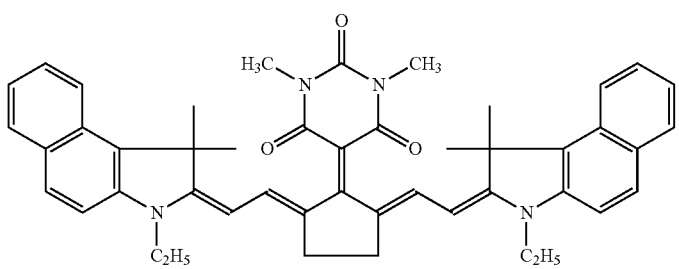
S0980
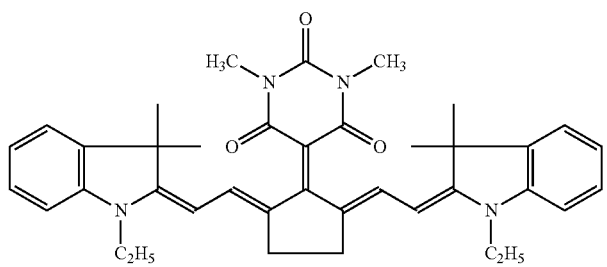 [SMILES: CCN1/C(=C/C=C2\CC/C(=C\C=C3\N(CC)c4ccccc4C3(C)C)C2=C2C(=O)N(C)C(=O)N(C)C2=O)C(C)(C)c2ccccc21]
S2265
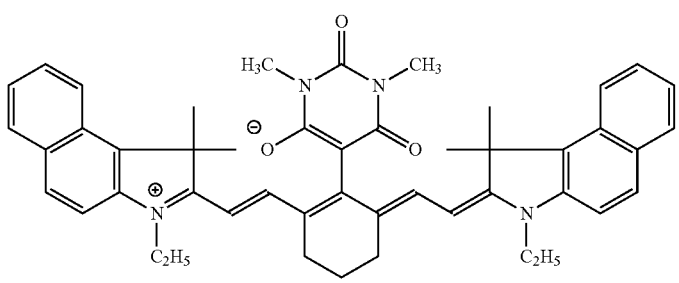 [SMILES: CCN1/C(=C/C=C2\CCCC(/C=C/C3=[N+](CC)c4ccc5ccccc5c4C3(C)C)=C2c2c([O-])n(C)c(=O)n(C)c2=O)C(C)(C)c2c1ccc1ccccc21]
S2266
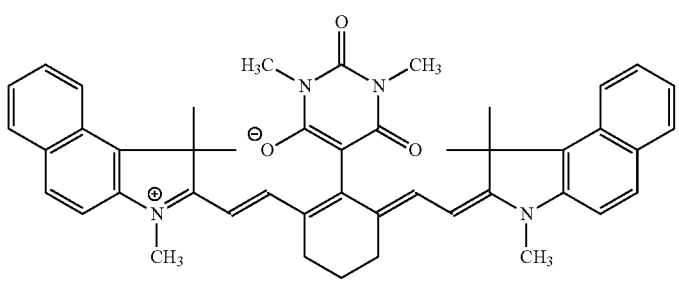 [SMILES: CN1/C(=C/C=C2\CCCC(/C=C/C3=[N+](C)c4ccc5ccccc5c4C3(C)C)=C2c2c([O-])n(C)c(=O)n(C)c2=O)C(C)(C)c2c1ccc1ccccc21]

S2330
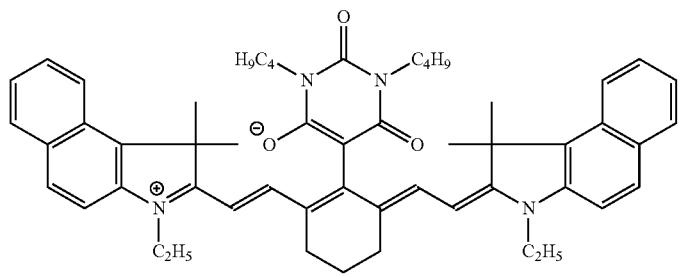
S2333
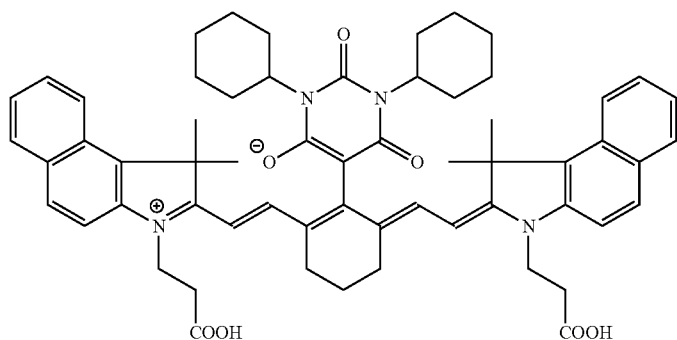 [SMILES: CC1(C)C(/C=C/C2=C(c3c([O-])n(C4CCCCC4)c(=O)n(C4CCCCC4)c3=O)C(=C/C=C3/N(CCC(=O)O)c4ccc5ccccc5c4C3(C)C)/CCC2)=[N+](CCC(=O)O)c2ccc3ccccc3c21]
S2342
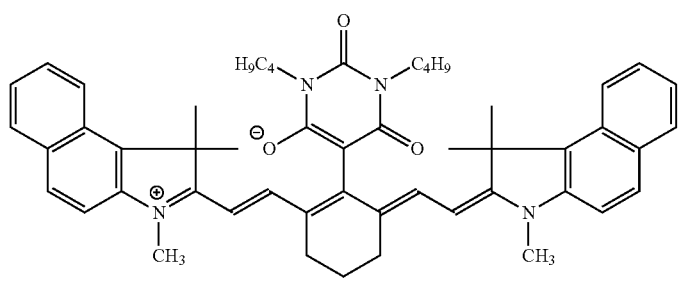
S2344
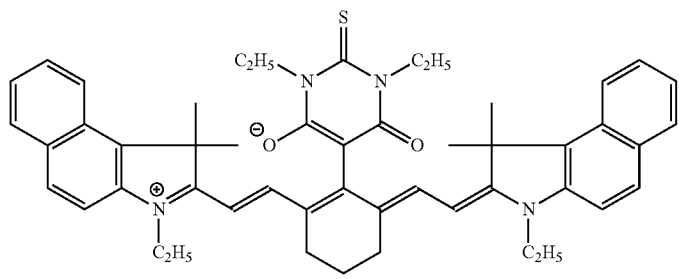
S2345
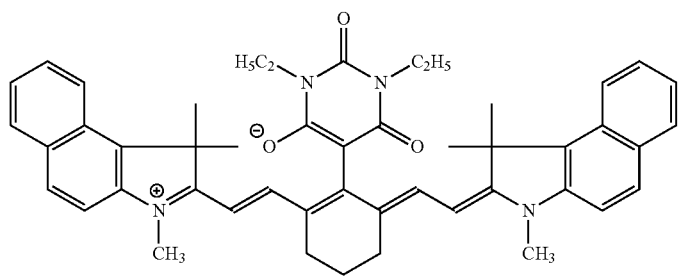

-continued

S2346 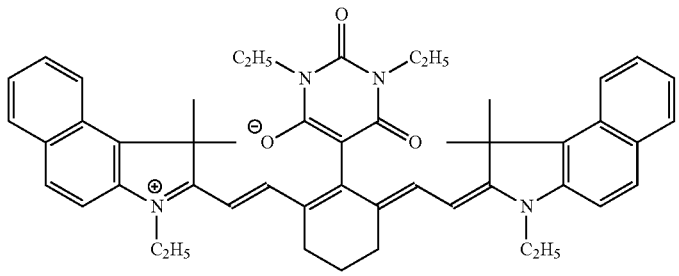 [SMILES: CCN1/C(=C/C=C2\CCCC(/C=C/C3=[N+](CC)c4ccc5ccccc5c4C3(C)C)=C2c2c([O-])n(CC)c(=O)n(CC)c2=O)C(C)(C)c2c1ccc1ccccc21]

S2190 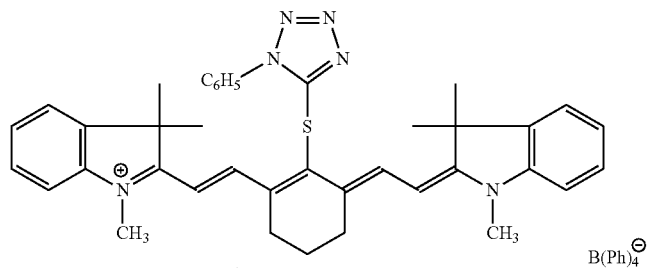

S2024 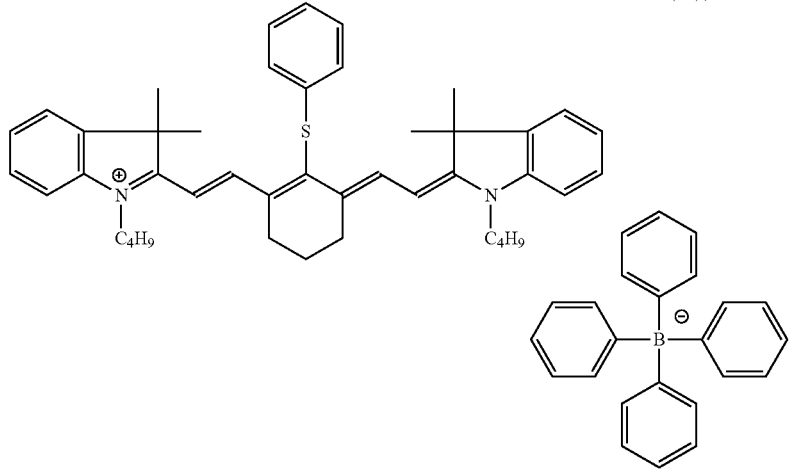

The negative-working imageable layers were coated to give a dry coating weight of about 1 g/m² (except in Invention Examples 1 and 2 having a dry coating weight of 1.3 g/m²) by dissolving the components of the respective formulations A-E as indicated below in TABLE I (in weight %) in Solvent Mixture A. These imageable layer formulations comprising a given IR dye as indicated below in TABLE II were coated onto the substrates also indicated in TABLE II using a bar coater followed by drying for 60 seconds for about 82° C. to provide negative-working lithographic printing plate precursors.

TABLE I

| Formulations | A | B | C | D | E |
|---|---|---|---|---|---|
| Oligomer A | 28.43% | 26.43% | 25.33% | 25.03% | 26.4% |
| SR602 | 14.5% | 14.1% | 13.9% | 13.7% | 13.6% |
| Klucel ® E | 4.00% | 4.00% | 4.00% | 4.00% | 4.00% |
| Elvacite ® 4026 | 4.00% | 4.00% | 4.00% | 4.00% | 4.00% |
| IB05 | 7.50% | 7.50% | 7.50% | 7.50% | 7.50% |
| Irgacure ® 250 | 0 | 0 | 2.50% | 2.50% | 2.50% |
| IR Dye X | 4.00% | 4.00% | 4.00% | 4.00% | 4.00% |
| IR dye S2190 | 0 | 0 | 0 | 0 | 2.00% |
| Copolymer A Latex | 34.80% | 32.60% | 31.40% | 30.90% | 33.20% |
| Byk ® 302 | 2.27% | 2.27% | 2.27% | 2.27% | 2.30% |
| Irganox ® 1035 | 0.50% | 0.50% | 0.50% | 0.50% | 0.50% |
| Blue 63 | 0 | 4.60% | 4.60% | 4.60% | 0 |
| $H_3PO_4$ | 0 | 0 | 0 | 1.00% | 0 |
| Total | 100% | 100% | 100% | 100% | 100% |

The negative-working lithographic printing plate precursors were exposed with a an image strips consisting of solids and 2×2 checker board at a range of power settings to give exposure energies of from 50 mJ/cm² to 180 mJ/cm² using a Trendsetter 800 II Quantum. The change in the color density is given as a ΔE value that is calculated using the L, a*, and b* values (as described in the CIE L*a*b* Color Space, International Commission on Illumination, CIE Publication 15.2, 1986) of the non-imaged area (L1, a*1, and b*1) and the imaged area (L2, a*2, and b*2) at 150 mJ/cm², and calculated as follows: $[(L1-L2)^2 (a*1-a*2)^2+(b*1-b*2)^3]^{1/2}$. This value provides a measure for print out, and generally the higher the ΔE value, the better the print out.

The ΔE value determined for each precursor is given in TABLE II below. The results show that all the dyes used according to the present invention in Invention Examples 1-26 and in Comparative Example 4 [where cyanine dyes had structures comprising the Structure (A) substituent], provided rather good print out values measured even after aging. In Comparative Examples 1-15 (except Comparative Example 4), the cyanine dyes present in the negative-working imageable layer demonstrated good print out when the precursors were fresh, but after aging, the precursor print out was strongly reduced or completely lost.

To evaluate the properties of the imaged precursors (and resulting lithographic printing plates) on-press, each of the imaged precursors described in TABLE II was directly mounted on a MAN Roland 04 press charged with Cora S 8900 Hartmann Black lithographic printing ink and 2.5% Yarn Supreme fountain solution (containing 8 weight % isopropanol). The printing press was started with each imaged precursor and the dampening system was engaged to wet them with fountain solution. After five revolutions of dampening, the lithographic inking system was engaged and after another five revolutions with ink, 1000 copies were printed.

DOP:

For each imaged precursor, the printed sheets were assessed for the number of sheets needed to print a clean background (DOP) and general image quality. The DOP was considered good when the fresh lithographic printing plates required less than 20 sheets to give clean copies, and the DOP was considered good when the aged lithographic printing plates required less than 50 sheets to give clean copies.

Printing Run Length:

Printing was continued for each lithographic printing plate to produce 20,000 copies at which time printing was discontinued. The aim regular exposure energy was about 150 mJ/cm². Image wear on the lithographic printing plates when

TABLE II

| Example | 1st IR Dye | 2nd IR Dye | Formulation | Substrate | ΔE (fresh) 150 mJ/cm² | ΔE (aged)* 150 mJ/cm² | DOP (fresh) | DOP (aged)* | Solid exposure** |
|---|---|---|---|---|---|---|---|---|---|
| Invention 1 | S2265 | None | A | 1 | 7.6 | 5.0 | 2 | 35 | 50 mJ/cm² |
| Invention 2 | S2330 | None | A | 1 | 8.3 | 6.5 | 2 | 30 | 60 mJ/cm² |
| Invention 3 | S2330 | None | A | 2 | 5.7 | 4.4 | 2 | 30 | 70 mJ/cm² |
| Invention 4 | KAN169434 | None | A | 1 | 6.6 | 3.7 | 2 | 28 | 50 mJ/cm² |
| Invention 5 | KAN169429 | None | A | 1 | 4.1 | 3.3 | 2 | 10 | 80 mJ/cm² |
| Invention 6 | S2333 | None | A | 1 | 3.2 | 2.2 | 2 | 35 | 80 mJ/cm² |
| Invention 7 | KAN169301 | None | A | 1 | 4.0 | 3.7 | 2 | 10 | 70 mJ/cm² |
| Invention 8 | S2345 | None | A | 1 | 5.6 | 3.4 | 2 | 20 | 50 mJ/cm² |
| Invention 9 | KAN169527 | None | A | 1 | 6.1 | 2.7 | 2 | 40 | 50 mJ/cm² |
| Invention 10 | S2266 | None | A | 1 | 4.5 | 3.2 | 2 | 38 | 50 mJ/cm² |
| Invention 11 | S2342 | None | A | 1 | 5.7 | 3.4 | 2 | 40 | 50 mJ/cm² |
| Invention 12 | S2344 | None | A | 1 | 6.3 | 4.8 | 2 | 8 | 50 mJ/cm² |
| Invention 13 | S2346 | None | A | 1 | 5.7 | 5.0 | 2 | 35 | 50 mJ/cm² |
| Invention 14 | S2265 | None | A | 1 | 7.5 | 5.5 | 2 | 33 | 50 mJ/cm² |
| Invention 15 | S2344 | None | B | 1 | 10.0 | 5.7 | 2 | 8 | 50 mJ/cm² |
| Invention 16 | S2346 | None | B | 1 | 8.0 | 5.0 | 2 | 8 | 50 mJ/cm² |
| Invention 17 | S2330 | None | B | 1 | 8.0 | 5.3 | 2 | 8 | 50 mJ/cm² |
| Invention 18 | S2265 | None | B | 1 | 8.8 | 5.0 | 2 | 15 | 50 mJ/cm² |
| Invention 19 | S2344 | None | C | 1 | 12.5 | 7.1 | 2 | 25 | 50 mJ/cm² |
| Invention 20 | S2346 | None | C | 1 | 10.8 | 6.0 | 2 | 22 | 50 mJ/cm² |
| Invention 21 | S2330 | None | C | 1 | 10.6 | 5.2 | 2 | 28 | 50 mJ/cm² |
| Invention 22 | S2265 | None | C | 1 | 11.6 | 5.4 | 2 | 25 | 50 mJ/cm² |
| Invention 23 | S2344 | None | D | 1 | 14.4 | 8.0 | 2 | 17 | 50 mJ/cm² |
| Invention 24 | S2346 | None | D | 1 | 12.3 | 5.8 | 2 | 12 | 50 mJ/cm² |
| Invention 25 | S2330 | None | D | 1 | 12.1 | 6.1 | 2 | 15 | 50 mJ/cm² |
| Invention 26 | S2265 | None | D | 1 | 13.6 | 5.8 | 2 | 15 | 50 mJ/cm² |
| Comparative 1 | S0485 | S2190 | E | 1 | 5.5 | 1.2 | 2 | NA | 70 mJ/cm² |
| Comparative 2 | S0325 | S2190 | E | 1 | 3.3 | 0.2 | 5 | NA | 50 mJ/cm² |
| Comparative 3 | S0322 | S2024 | E | 1 | 3.0 | 1.8 | 8 | NA | 70 mJ/cm² |
| Comparative 4 | S0322 | None | A | 1 | 4.3 | 0.5 | 2 | >1000 | 50 mJ/cm² |
| Comparative 5 | S0322 | None | D | 2 | 4.1 | Not visible | 9 | >1000 | 70 mJ/cm² |
| Comparative 6 | S0322 | None | C | 1 | 4.9 | Not visible | 2 | >1000 | 50 mJ/cm²⁺ |
| Comparative 7 | S0322 | None | A | 2 | 4.9 | Not visible | 12 | >1000 | 70 mJ/cm² |
| Comparative 8 | S0325 | None | D | 2 | 3.1 | Not visible | 10 | >1000 | 70 mJ/cm² |
| Comparative 9 | S0325 | None | C | 1 | 4.3 | 0.6 | 5 | >1000 | 60 mJ/cm² |
| Comparative 10 | S0325 | None | A | 2 | 3.3 | Not visible | 8 | >1000 | 100 mJ/cm² |
| Comparative 11 | S0325 | None | A | 1 | 3.1 | Not visible | 2 | >1000 | 70 mJ/cm² |
| Comparative 12 | S0485 | None | A | 1 | 6.3 | 0.4 | 5 | >1000 | 60 mJ/cm² |
| Comparative 13 | S0485 | None | D | 2 | 5.5 | 1.2 | 20 | >1000 | 70 mJ/cm² |
| Comparative 14 | S0980 | None | A | 1 | 3.4 | Not visible | 15 | >1000 | 60 mJ/cm² |

*5 days at 40° C. and 80% relative humidity
**Without wear at 20,000 copies
NA = not available under exposed, provided an indication whether the lithographic printing plates can provide acceptable printing run length. Image wear observed at exposure energies above 100 mJ/cm² after 20,000 copies was considered an indication that the lithographic printing plate did provide acceptable printing run length.

The image strip with the lowest energy showing no wear at 20,000 copies was evaluated and the results are shown in the last column of TABLE II above. The lithographic printing plate precursors that were prepared according to the present invention containing the desired cyanine dyes demonstrated desired printing run length and acceptable image wear at exposure energies far below 100 mJ/cm².

In Comparative Examples 1-3, which used precursors containing cyanine IR dyes with barbiturate substituents on a cyclopentylene ring together with a second IR dye, both acceptable DOP and printing run length were obtained. However, with these precursors, good print out observed with the fresh samples was considerably reduced or lost after the precursors had been aged.

In addition, the precursors used in Comparative Examples 4-14 containing any of a number of other cyanine IR dyes with barbiturate substituents on a cyclopentylene ring, exhibited good DOP and printing run length but they also lost nearly all printout after the precursors had been aged.

The data provided in these examples thus demonstrate that the precursors of the present invention, comprising only the described cyanine IR dyes having two same or different heterocyclic groups that are connected to each other by a methine chain comprising a cyclohexylene ring that carries a substituent represented by Structure (A), provided good printing properties and also exhibited desired print out (measured using ΔE) while retaining good ΔE values after they had been aged.

The invention has been described in detail with particular reference to certain preferred embodiments thereof, but it will be understood that variations and modifications can be effected within the spirit and scope of the invention.

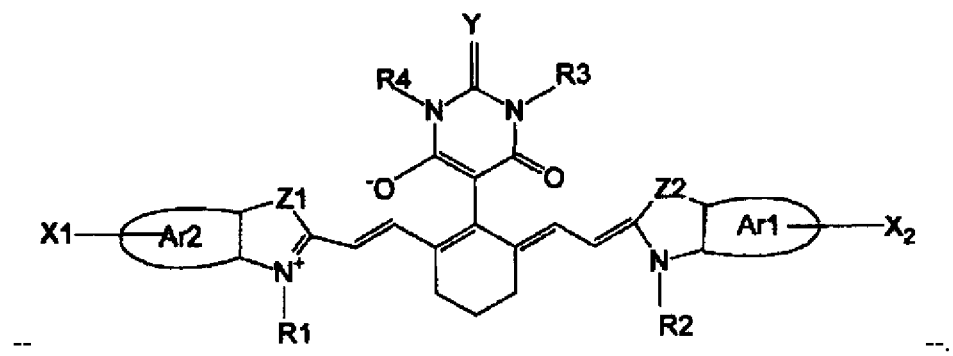

The invention claimed is:

1. A method for providing a lithographic printing plate comprising:
   imagewise exposing a negative-working lithographic printing plate precursor comprising a negative-working imageable layer to infrared radiation to provide an imaged precursor comprising exposed and non-exposed regions in the negative-working imageable layer, and
   processing the imaged precursor on-press to remove the negative-working imageable Layer in the non-exposed regions with a lithographic printing ink, fountain solution, or both a lithographic printing ink and fountain solution,
   wherein the negative-working lithographic printing plate precursor comprises a substrate and the negative-working imageable layer disposed on the substrate,
   the negative-working imageable layer comprising an infrared radiation absorber, a compound to provide free radicals upon exposure to infrared radiation in the presence of the infrared radiation absorber, a free radical polymerizable compound, and optionally a polymer binder,
   wherein the infrared radiation absorber is a cyanine dye represented by Formula (1a):

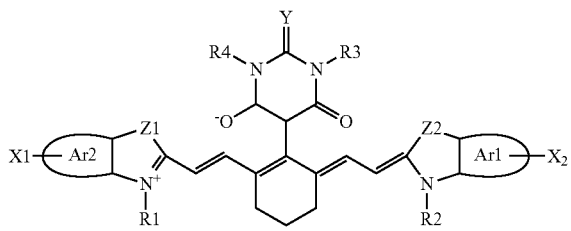

(1a)

wherein Z1 and Z2 independently represent S, O, NR$^a$, or C(R$^b$)$_2$,

R1 and R2 independently represent hydrogen or a substituted or unsubstituted alkyl group, R3 and R4 are independently hydrogen or substituted or unsubstituted alkyl, substituted or unsubstituted alkoxy, substituted or unsubstituted aryl, or substituted or unsubstituted cycloalkyl groups, Ar1 and Ar2 are independently aromatic hydrocarbon groups that can have one or more substituents X1 and X2 that independently represent hydrogen, a substituted or unsubstituted alkyl group, —COOR$^a$, —OR$^a$, —SR$^a$, or —N(R$^a$)$_2$ group, or a halogen atom, R$^a$ represents a hydrogen atom, or a substituted or unsubstituted alkyl or aryl group, R$^b$ represents an alkyl groups having 1 to 4 carbon atoms, and Y represents O or S.

2. The precursor of claim 1, wherein the infrared radiation absorber is present in the negative-working imageable layer in an amount of at least 0.2 weight % and up to and including 20 weight %.

3. The precursor of claim 1, wherein the negative-working imageable layer comprises a polymeric binder as discrete particles, or pendant groups comprising ethylenically unsaturated polymerizable groups.

4. The precursor of claim 1, wherein the compound to provide free radicals upon exposure to infrared radiation in the presence of the infrared radiation absorber is an onium salt.

5. The precursor of claim 1, wherein the compound to provide free radicals upon exposure to infrared radiation in the presence of the infrared radiation absorber is an iodonium salt.

6. The precursor of claim 1, wherein the compound to provide free radicals upon exposure to infrared radiation in the presence of the infrared radiation absorber is an iodonium tetraaryl borate.

7. The precursor of claim 1, wherein the negative-working imageable layer further comprises a compound that changes color in the presence of a strong acid.

8. The precursor of claim 1, wherein the compound to provide free radicals upon exposure to infrared radiation in the presence of the infrared radiation absorber, comprises an iodonium tetraaryl borate and an onium salt whose anion is not a tetraaryl borate anion.

9. The precursor of claim 1, comprising one or more infrared radiation absorbers represented by Formula 1a, and no other infrared radiation absorbers.

* * * * *

UNITED STATES PATENT AND TRADEMARK OFFICE
CERTIFICATE OF CORRECTION

PATENT NO. : 8,927,197 B2
APPLICATION NO. : 13/678625
DATED : September 1, 2009
INVENTOR(S) : Savariar-Hauck et al.

Page 1 of 3

It is certified that error appears in the above-identified patent and that said Letters Patent is hereby corrected as shown below:

In the Specification

In Column 3, line 32, delete Formula (1a)

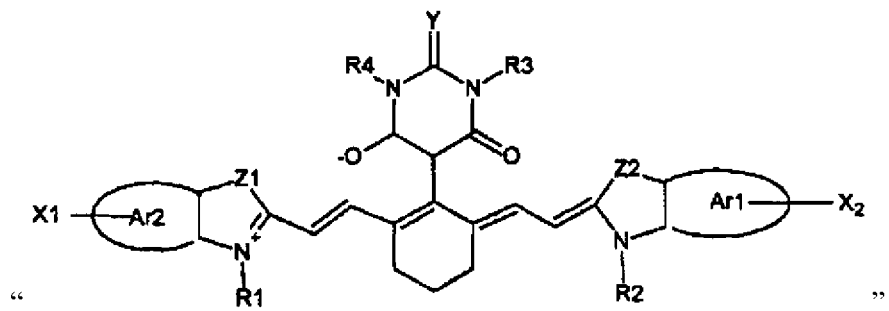

" "

and insert Formula (1a)

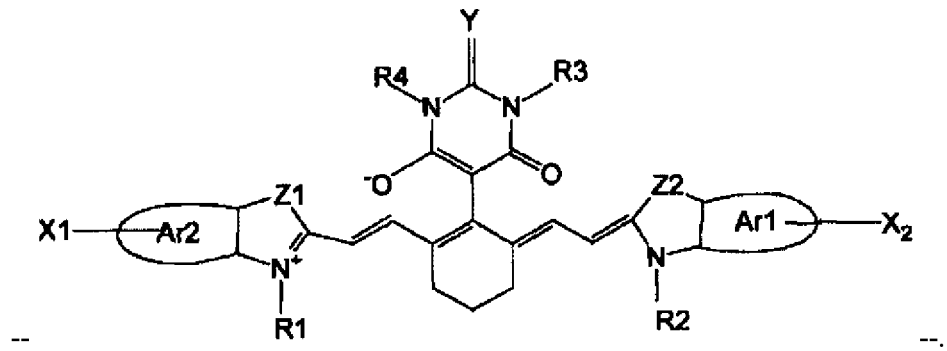

-- --.

Signed and Sealed this
Fourteenth Day of April, 2015

Michelle K. Lee
*Director of the United States Patent and Trademark Office*

CERTIFICATE OF CORRECTION (continued)
U.S. Pat. No. 8,927,197 B2

In Column 5, line 28, delete Formula (1a)

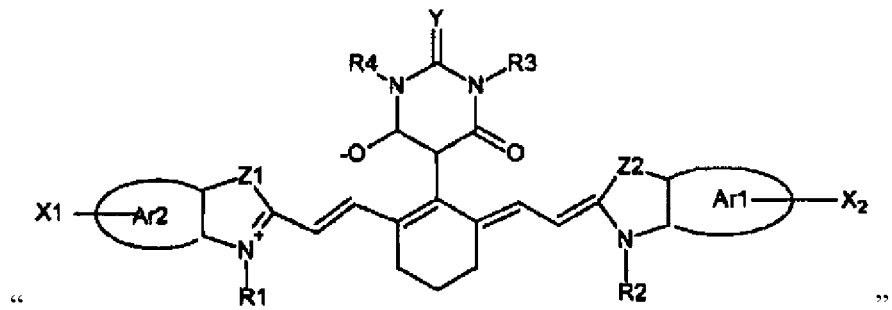

" "

and insert Formula (1a)

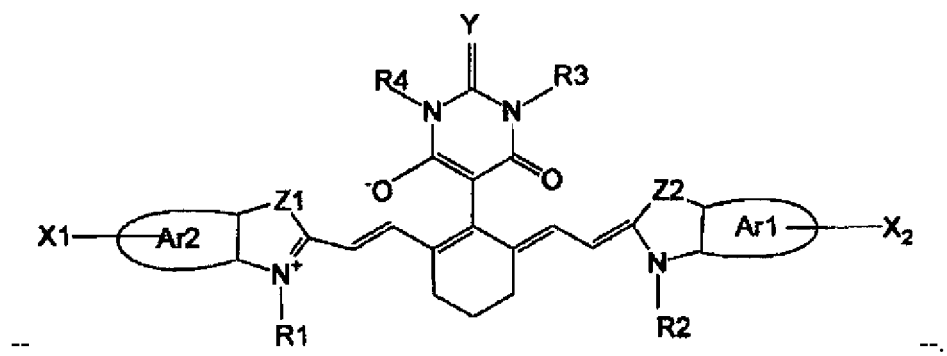

-- --.

In the Claims

In Column 28, line 2, (Claim 1), delete Formula (1a)

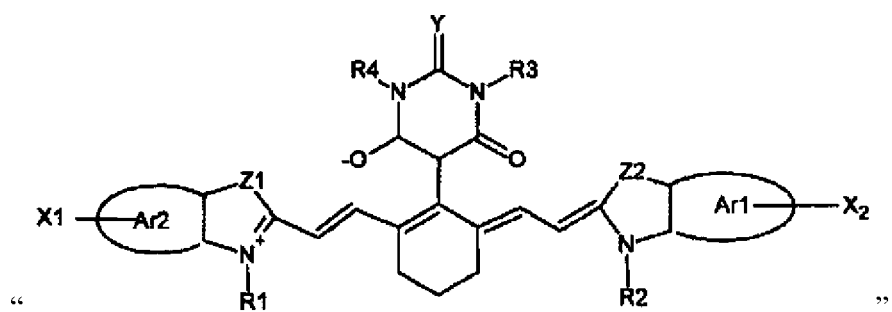

" "

CERTIFICATE OF CORRECTION (continued)
U.S. Pat. No. 8,927,197 B2

Page 3 of 3 and insert Formula (1a)